United States Patent
Takagi

(10) Patent No.: US 7,486,157 B2
(45) Date of Patent: Feb. 3, 2009

(54) PACKAGE FOR HIGH FREQUENCY WAVES CONTAINING HIGH FREQUENCY ELECTRONIC CIRCUIT

(75) Inventor: Kazutaka Takagi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 337 days.

(21) Appl. No.: 11/509,764

(22) Filed: Aug. 25, 2006

(65) Prior Publication Data

US 2007/0080763 A1   Apr. 12, 2007

(30) Foreign Application Priority Data

Sep. 14, 2005   (JP) ............................. 2005-266938

(51) Int. Cl.
*H03H 7/38* (2006.01)
(52) U.S. Cl. ......................................... 333/34; 333/260
(58) Field of Classification Search .................. 333/34, 333/260, 238, 246, 247
See application file for complete search history.

(56) References Cited

U.S. PATENT DOCUMENTS

| | | | |
|---|---|---|---|
| 4,698,661 A | 10/1987 | Bessonneau et al. | |
| 4,925,024 A | 5/1990 | Ellenberger et al. | |
| 5,774,026 A | 6/1998 | Cunin et al. | |
| 6,441,697 B1 * | 8/2002 | Garland et al. | 333/34 |
| 6,639,487 B1 * | 10/2003 | Salmela et al. | 333/34 |

FOREIGN PATENT DOCUMENTS

| | | |
|---|---|---|
| EP | 0 228 146 | 7/1987 |
| EP | 0 235 503 | 9/1987 |
| JP | 54-101648 | 8/1979 |
| JP | 55-136710 | 10/1980 |
| JP | 7-94649 | 4/1995 |
| WO | WO 00/75990 A1 | 12/2000 |

* cited by examiner

*Primary Examiner*—Stephen E Jones
(74) *Attorney, Agent, or Firm*—Oblon, Spivak, McClelland, Maier & Neustadt, P.C.

(57) ABSTRACT

In an embodiment of the invention, a package for high frequency waves mounted by a high frequency electronic circuit comprises an hermetic box-shaped high frequency package containing a high frequency electronic circuit in the inside and shielded by a conductor, an input terminal and an output terminal partly led out to the outside of the high frequency package, an input side feed-through section having one of its opposite ends connected to the input terminal and the other end connected to the high frequency electronic circuit and having a predetermined characteristic impedance; and an output side feed-through section having one of its opposite ends connected to the output terminal and the other end connected to the high frequency electronic circuit and having a characteristic impedance lower than the characteristic impedance of the input side feed-through section as viewed from the output terminal side.

8 Claims, 2 Drawing Sheets

PACKAGE FOR HIGH FREQUENCY WAVES CONTAINING HIGH FREQUENCY ELECTRONIC CIRCUIT

CROSS-REFERENCE TO RELATED APPLICATION

This invention contains subject matter related to Japanese Patent Application JP 2005-266938 filed on Sep. 14, 2005, the entire contents of which are incorporated herein by reference.

BACKGROUND OF THE INVENTION (1) Field the Related Art

The present invention relates to a package for high frequency waves and, more particularly, it relates to a high performance package for high frequency waves that enables outputting a large electric current.

(2) Description of the Related Art

Devices and instruments are generally designed as 50Ω type in the field of microwaves.

Similarly, as for packages for high frequency waves that contain elements for high frequency waves and matching circuits, characteristic impedances are generally designed as 50Ω type as viewed from the input terminal and the output terminal. Additionally, the input terminal and the output terminal are normally made to show a same profile and a same size regardless of the level of the flowing electric current. However, signals are more often than not amplified depending on the element circuits for high frequency waves contained in a high frequency package, a large electric current flows to the output terminal if compared with the input terminal.

For example, if the characteristic impedance of a feed-through section sandwiched between 0.6 mm-thick ceramic pieces is 50Ω, the line width is 0.6 mm and the limit for metal thickness is about 0.1 μm for achieving hermetic condition when sandwiched between ceramic pieces. Then, a large ohm loss is produced when an electric current is flowed to a line showing such a relatively high resistance. For this reason, there arises a problem that the applied voltage is not effectively conveyed to a semiconductor chip and the line can be fused by Joule heat generated when an electric current flows through the resistance components at the output terminal side to make it impossible to obtain a sufficient current capacity.

GaAs FET packages where the input side gate terminal is made to show a small width to raise the impedance so as to be used as part of a noise factor matching circuit are known and disclosed in Jpn. Pat. Appln. Laid-Open Publication No. 7-94649. However, such a package also has high resistance components at the output side to make it impossible to obtain a sufficient current capacity and hence can give rise to the above described problem. Additionally, such a package is also accompanied by a drawback that the high frequency characteristics are damaged when the line width of the input terminal or the output terminal is changed abruptly.

In view of the above identified problems, it is therefore the object of the present invention to provide a high performance package for high frequency waves containing a high frequency electronic circuit that can secure a sufficient current capacity at the output section and shows good frequency characteristics.

In an aspect of the present invention, the above object is achieved by providing a package for high frequency waves comprising: an hermetic box-shaped high frequency package containing a high frequency electronic circuit in the inside and shielded by a conductor; an input terminal and an output terminal partly led out to the outside of the high frequency package; an input side feed-through section having one of its opposite ends connected to the input terminal and the other end connected to the high frequency electronic circuit and having a predetermined characteristic impedance; and an output side feed-through section having one of its opposite ends connected to the output terminal and the other end connected to the high frequency electronic circuit and having a characteristic impedance lower than the characteristic impedance of the input side feed-through section as viewed from the output terminal side.

Thus, according to the present invention, it is possible to raise the current capacity at the output side of a package for high frequency waves by having line width wider, that is having the characteristic impedance of the output side feed-through section lower than the characteristic impedance of the input side feed-through section within a range that allows matching the internal high frequency circuit.

DETAILED DESCRIPTION OF THE INVENTION

Now, the present invention will be described in greater detail by referring to the accompanying drawings that illustrate a preferred embodiment of the invention.

Figure 1:
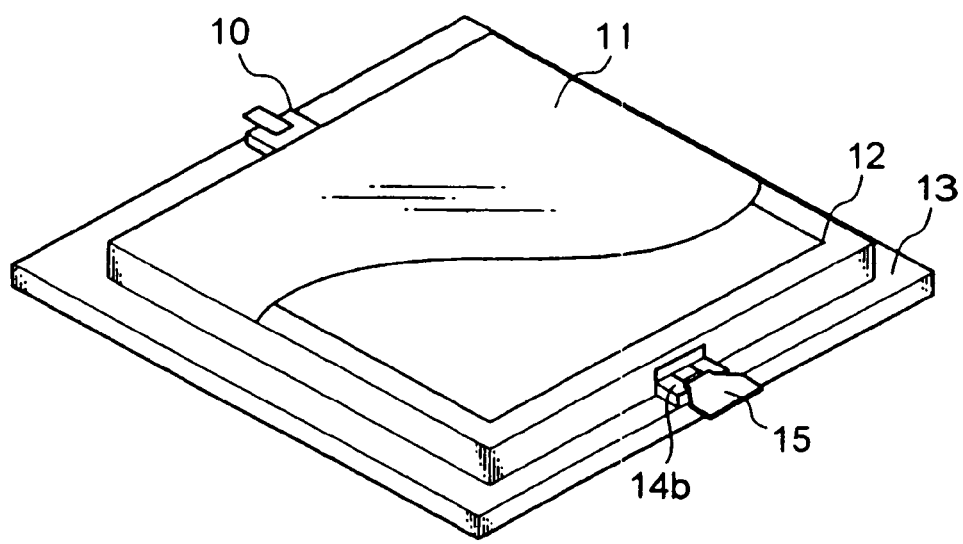
FIG. 1 is a schematic bird's-eye view of an embodiment of package for high frequency waves according to the present invention.

FIG. 1 is a schematic bird's-eye view of an embodiment of package for high frequency waves according to the present invention. The lower grounded metal plate 13 of the embodiment of package for high frequency waves needs to be made of a metal showing good grounded characteristics and, at the same time, a good thermal conductivity. Examples of metals that can be used for the grounded metal plate include Cu, CuW (copper tungsten) and CuMo (copper molybdenum). A ceramic plate having a thickness of about 0.6 mm is used as terminal forming substrate, which will make a lower dielectric 17b as will be described hereinafter.

A metal frame 12 that is typically about 0.7 mm width and about 5 to 8 mm high and made of Cu or an alloy of Fe, Ni and Co is bonded onto the surface of the grounded metal plate 13.

The metal frame 12 has notches where an input terminal 10 and an output terminal 15 are formed by way of a feed-through section 14. A metal-made cover 11 is bonded onto the surface of the frame. Metals of the grounded metal plate 13, the metal frame 12 and the cover 11 need to have respective thermal expansion coefficients that are substantially equal to each other. Additionally, they have to be selected from the viewpoint of easy machining.

Figure 2A:
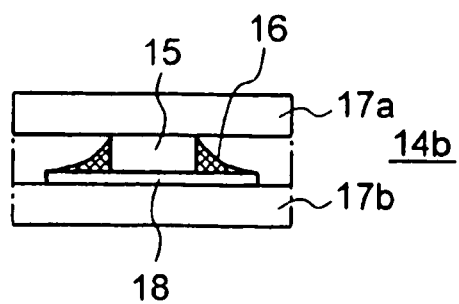
FIG. 2A is a schematic cross sectional view of the output side feed-through section of the embodiment of FIG. 1, illustrating the structure thereof.
Figure 2B:
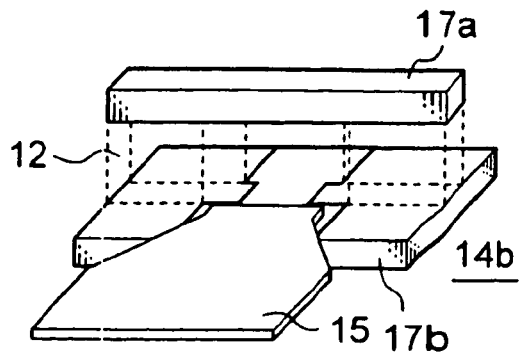
FIG. 2B is a schematic perspective view of the output side feed-through section of the embodiment of FIG. 1, illustrating the structure thereof.

FIG. 2A is a schematic cross sectional view of the output side feed-through section 14b in the vicinity of the output terminal 15 of the embodiment of package for high frequency waves and FIG. 2B is a schematic perspective view of the output side feed-through section 14b of the embodiment, illustrating the structure thereof. The output side feed-through section 14b is-formed by sandwiched a signal line 18 that operates as through conductor between an upper dielectric 17a and a lower dielectric 17b. The upper dielectric 17a and the lower dielectric 17b are typically made of ceramic.

The lower dielectric 17b is made longer than the upper dielectric 17a and each of the lower dielectric 17b and the upper dielectric 17a is made connectable to the output terminal and a bonding such as a wire at the opposite sides thereof. The output terminal 15 is soldered and bonded onto the signal line 18 at the outside of the feed-through section 14. Since a meniscus profile 16 is produced at this time to show a contour that appears like of a attenuation curve by the surface tension of the solder so that the signal line 18 and the output terminal 15 are bonded highly reliably.

A feed-through section is formed both at the input side and at the output side. As seen in FIG. 3, the input side feed-through section is denoted by 14a and the output side feed-through section is denoted by 14b. The feed-through sections 14a and 14b have similar respective structures except their dimensions.

Thus, the package for high frequency waves comprises a grounded metal plate 13, a metal frame 12, a cover 11, an input side feed-through section 14a and an output side feed-through section 14b and the inside thereof is made hermetic typically by sealing it with nitrogen.

FIGS. 3A, 3B, 3C and 3D schematically illustrate the structure of this embodiment of package for high frequency waves.

Figure 3A:
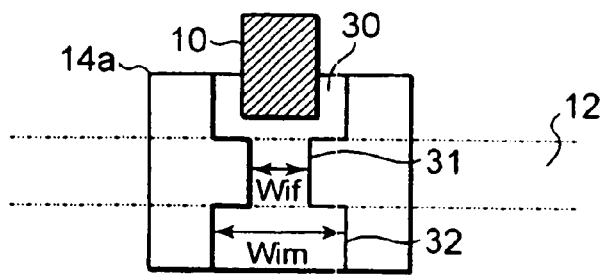
FIG. 3A is a schematic plan view of the input side feed-through section of the embodiment of FIG. 1.
Figure 3B:
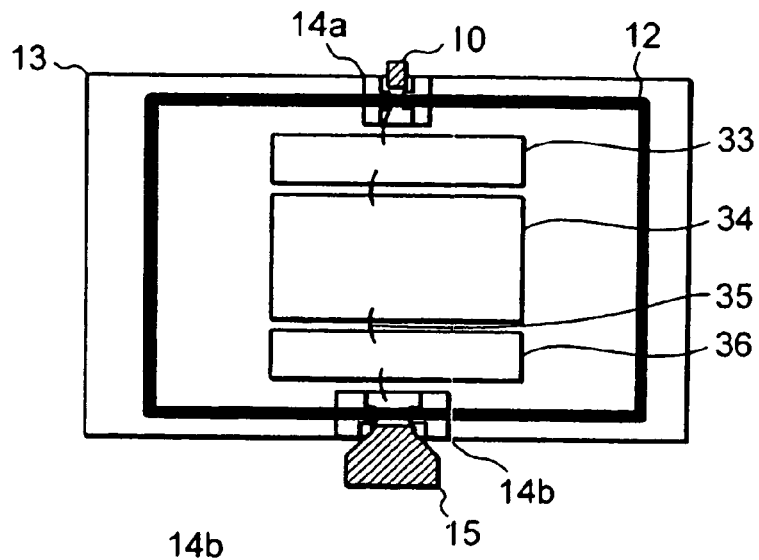
FIG. 3B is a schematic plan view of the embodiment of package for high frequency waves of FIG. 1.
Figure 3C:
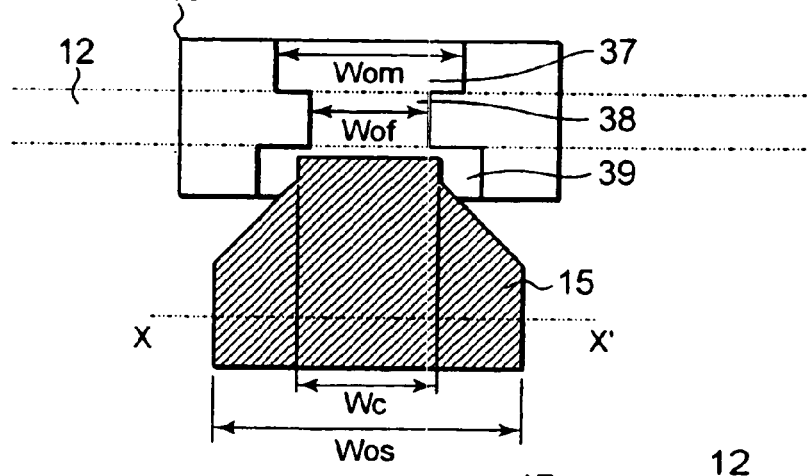
FIG. 3C is a schematic plan view of the output side feed-through section of the embodiment of FIG. 1.
Figure 3D:
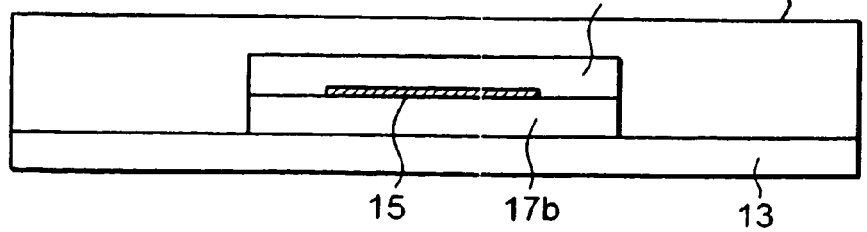
FIG. 3D is a schematic cross sectional view of the embodiment of package for high frequency wave of FIG. 1 taken along X-X' line in FIG. 3C, showing the high frequency package thereof.

FIG. 3A is an enlarged schematic plan view of the input side feed-through section 14a of the package for high frequency waves. FIG. 3B is a schematic plan view of the package for high frequency waves, showing the inside thereof. FIG. 3C is an enlarged schematic plan view of the output side feed-through section 14b. FIG. 3D is a schematic cross sectional view of the package for high frequency wave taken along X-X' line in FIG. 3C.

Referring to FIG. 3B, the input terminal 10 is connected to an input matching circuit 33 at a bonding 35 by way of the input side feed-through section 14a. The expression of a bonding as used herein refers to a spot where electric connection is established typically by means of wire bonding, ribbon boding.

The input matching circuit 33 is connected to a field effect transistor (FET) or a monolithic microwave integrated circuit (MMIC) that constitutes an electronic circuit 34 at a bonding 35, while the electronic circuit 34 that is mounted internally is connected to an output side matching circuit 36 at a bonding 35, which output matching circuit 36 is connected to the output terminal 15 by way of a bonding 35 and the output side feed-through section 14b.

As shown in FIGS. 2A and 2B, the output side feed-through section 14b is formed by a through conductor that operates as the signal line 18, the upper dielectric 17a and the lower dielectric 17b, the upper dielectric 17a and the lower dielectric 17b being typically made of ceramic. Output side micro-strip lines 37, 39 are formed on the lower dielectric 17b. The characteristic impedances of each of them as viewed from the input side or the output side are determined by the electrostatic capacity it produces with the grounded metal plate 13 and the inductance component of its own.

The input side feed-through section 14a has a configuration substantially same as the output side feed-through section 14b. More specifically, the signal line 18 is sandwiched between the upper dielectric 17a and the lower dielectric 17b that are typically made of ceramic and surrounded by the conductors of the metal frame 12 and the grounded metal plate 13. The width Wif of the input side feed-through line 31 is reduced if compared with the width Wim of the micro-strip lines 30, 31 at the part thereof that is surrounded by the metal frame 12 in order to make that part show an impedance substantially same as the preceding and succeeding parts thereof (see FIG. 2B) FIG. 3A shows the input side feed-through section 14a when the characteristic impedance is 50Ω. Taking the thickness of the lower dielectric 17b, the line width Wif of the input side feed-through line 31 is about 0.4 mm and the line width Wim of the micro-strip lines 30, 32 is about 0.6 mm. The input terminal 10 is soldered and bonded onto the micro-strip line 30.

In order to bond the input terminal and the signal line well, it is preferable to produce a meniscus structure as described above by referring to FIG. 2A. A meniscus region requires at least 0.1 mm for this embodiment. Therefore, the width of the input terminal 10 needs to be made smaller by 0.2 mm than the width of the micro-strip line 30 for the purpose of forming a meniscus region. Thus, it is possible to bond the input terminal 10 and the micro-strip line 30 well by reducing the width of the input terminal 10 to about 0.4 mm.

On the other hand, FIG. 3C shows the dimensions of the output side feed-through section 14b when the characteristic impedance is assumed to be about 30Ω. The line width Wom of the micro-strip line 37 can be increased to 0.9 mm while the line width Wof of the feed-through line 38 can be increased to 0.7 mm by lowering the characteristic impedance, taking the thickness of the lower dielectric 17b into consideration.

If 0.1 mm is spared for forming each meniscus region as described above by referring to FIGS. 2A and 2B, it is possible to secure about 0.7 mm for the line width Wc in thesolder bonding region of the output terminal 15. Then, it is possible to make the line width greater than the input terminal 10, which is 0.4 mm when the characteristic impedance is 50Ω. The line width of the micro-strip line 39 is made to be substantially equal to that of the micro-strip line (1 to 2 mm) of an external substrate (not shown) on which a package according to the present invention is mounted in order to make them match each other well. In other words, the line width of the micro-strip line 39 is made greater than the line width Wom of the micro-strip line 37.

Referring to FIG. 3C, the width Wos of the output terminal 15 is about 1 to 2 mm but turned to a smaller width Wc at a part of the output terminal 15 where it is bonded to the micro-strip line 39 to produce a structure that satisfactorily secure meniscus when the output terminal 15 is soldered to the micro-strip line 39 and hence good bonding characteristics.

More specifically, the output terminal 15 is tapered toward the part thereof where it is soldered to the micro-strip line 39 to reduce its width from Wos. Differently stated, the output terminal 15 gradually increases its width as it moves away from the corresponding end of the micro-strip line 39.

This tapered profile is devised to prevent the output signal from being reflected because a reflected wave, if produced, degrades the performance of the external terminal if the width of the external terminal is changed abruptly.

As described above, the line width of the micro-strip line in the feed-through section and also that of the feed-through section are increased at the output terminal side to lower the characteristic impedance to below 50Ω. Thus, it is possible to establish matching with the external circuit at the output side by designing the matching circuit in the inside of the package, reducing the impedance to about 30Ω and its electric length to less than ¼ of the wavelength, taking the impedance of the terminal into consideration.

With this arrangement, the signal line is no longer fused by Joule heat at the output terminal side when a circuit that requires a large electric current is mounted.

Thus, it is possible to establish matching at the input side by reducing the line width of the input terminal that does not require any current capacity and holding the characteristic impedance to 50Ω in this embodiment of package for high frequency waves having the above described configuration.

In other words, it is possible to design the feed-through section so as to make it show a wide line width by lowering the characteristic impedance within a range that allows a good matching with the internal circuit only for the output terminal that requires a current capacity for the package for high frequency waves. Then, the matching with the line width of the micro-strip line of the external circuit substrate is improved the high frequency characteristics by gradually and continuously broadening the external output terminal. Thus, it is possible to provide a high performance semiconductor package with high output and good frequency characteristics.

Particularly, from the viewpoint of the above-described embodiment, the number of bonding wires to be connected can be increased by increasing the line width of the micro-strip line 37 in order to prevent the bonding wires from being fused by a large electric current. It is highly desirable to raise the width of the feed-through line 38 of the output side feed-through section from the viewpoint of preventing fusion by a large electric current. Thus, it is possible to prevent fusion from taking place at the output side by a large electric current by increasing the line width of the feed-through line 38 and those of the micro-strip lines 37, 38 at the output terminal side within an allowable range from the viewpoint of matching with the high frequency electronic circuit.

Additionally, it is desirable to make the line width of the micro-strip line 39 greater than that of the micro-strip line 37 from the viewpoint of raising the width of the output terminal 15 and forming a meniscus structure sufficient for achieving a good bonding characteristic at the soldered connecting section of the output terminal 15 and the micro-strip line 39.

The present invention is by no means limited to the above-described embodiment and can be embodied in various different ways without departing from the spirit and scope of the present invention.

The line width of the micro-strip lines, 37, 38 at the output side feed-through section and the line width of the feed-through line of the above described embodiment are not limited to the above described ones and can be increased to lower the characteristic impedance within an allowable range from the viewpoint of matching with the high frequency electronic circuit contained in the high frequency package as viewed from the external terminal. The width of the external terminal can also be increased for the same reason.

While only the output terminal requires a current capacity for a package for high frequency waves according to the present invention in the above description, a similar arrangement can be provided at the input terminal side if a current capacity is required at the input terminal side.

While a FET or a MMIC is arranged in the high frequency package as high frequency electronic circuit in the above description, the above-described idea is equally applicable to a bipolar transistor. Finally, while an input matching circuit 33 and an output matching circuit 36 are arranged in the above described embodiment, either or both of them are not required if the mounted high frequency electronic circuit comprises either or both of them, whichever appropriate.

What is claimed is:

1. A package for high frequency waves comprising:
an box-shaped high frequency package containing a high frequency electronic circuit in the inside and shielded by a conductor;
an input terminal and an output terminal partly led out to the outside of the high frequency package; and
an input side feed-through section and an output side feed-through section arranged to respectively connect the input terminal and the output terminal to the high frequency electronic circuit mounted in the high frequency package, maintaining an hermetic condition,
each of the input side feed-through section and the output side feed-through section having a first micro-strip line connected to the high frequency circuit, a second micro-strip line connected to the output terminal and the input terminal and a feed-through line connecting the first and second micro-strip lines, maintaining an hermetic condition for them;
the line width of the output terminal side feed-through line and those of the first and second micro-strip lines being increased so as to obtain a required current capacity within a range allowable for matching with the high frequency electronic circuit.

2. The package according to claim 1, wherein
the width of the output terminal is smaller than the line width of the second micro-strip line and increased as a function of the distance from the second micro-strip line to make the output terminal show a tapered profile.

3. A package for high frequency waves containing therein a high frequency electronic circuit, the package comprising:
an hermetic box-shaped high frequency package containing a high frequency electronic circuit in the inside and shielded by a conductor;
an input terminal and an output terminal partly led out to the outside of the high frequency package;
an input side feed-through section having one of its opposite ends connected to the input terminal and the other end connected to the high frequency electronic circuit and having a predetermined characteristic impedance; and
an output side feed-through section having one of its opposite ends connected to the output terminal and the other end connected to the high frequency electronic circuit and having a characteristic impedance lower than the characteristic impedance of the input side feed-through section as viewed from the output terminal side.

4. The package according to claim 3, wherein
each of the input side feed-through section and the output side feed-through section has a first micro-strip line connected to the high frequency circuit, a second micro-strip line connected either to the output terminal or the input terminal having a predetermined line width and a feed-through line connecting the first and second micro-strip lines, and
at least the line width of the feed-through line of the output side feed-through section is made greater than the line width of the feed-through line of the input side feed-through section while the width of the output terminal is made greater than the width of the input terminal.

5. The package according to claim 4, wherein
the width of the output terminal is made narrower than the line width of the second micro-strip line at the part thereof where it is soldered to the second micro-strip line of the output side feed-through section to form a meniscus structure.

6. A package for high frequency waves containing therein a high frequency electronic circuit, the package comprising:

an hermetic box-shaped high frequency package containing a high frequency electronic circuit, an input matching circuit and an output matching circuit, the input matching circuit and the output matching circuit being connected to the high frequency electronic circuit, in the inside and shielded by a conductor;

an input terminal and an output terminal partly led out to the outside of the high frequency package;

an input side feed-through section having one of its opposite ends connected to the input terminal and the other end connected to the input matching circuit and having a predetermined characteristic impedance; and an output side feed-through section having one of its opposite ends connected to the output terminal and the other end connected to the output matching circuit and having a characteristic impedance lower than the characteristic impedance of the input side feed-through section as viewed from the output terminal side.

7. The package according to claim 6, wherein each of the input side feed-through section and the output side feed-through section has a first micro-strip line connected to the input matching circuit or the output matching circuit, a second micro-strip line connected either to the output terminal or the input terminal, whichever appropriate, having a predetermined line width and a feed-through line connecting the first and second micro-strip lines, and at least the line width of the feed-through line of the output side feed-through section is made greater than the line width of the feed-through line of the input side feed-through section while the width of the output terminal is made greater than the width of the input terminal.

8. The package according to claim 7, wherein the width of the output terminal is made narrower than the line width of the second micro-strip line at the part thereof where it is soldered to the second micro-strip line of the output side feed-through section to form a meniscus structure.

* * * * *